United States Patent
Reddy et al.

(10) Patent No.: US 12,525,981 B2
(45) Date of Patent: Jan. 13, 2026

(54) FRACTIONAL FREQUENCY DIVIDER

(71) Applicant: TEXAS INSTRUMENTS INCORPORATED, Dallas, TX (US)

(72) Inventors: Narala Reddy, Bestavaripeta Mandal (IN); Peeyoosh Mirajkar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 55 days.

(21) Appl. No.: 18/680,518

(22) Filed: May 31, 2024

(65) Prior Publication Data

US 2025/0167787 A1 May 22, 2025

(30) Foreign Application Priority Data

Nov. 21, 2023 (IN) .............................. 202341079142

(51) Int. Cl.
*H03K 23/00* (2006.01)
*H03K 23/58* (2006.01)

(52) U.S. Cl.
CPC .................................... *H03K 23/58* (2013.01)

(58) Field of Classification Search
CPC ........ H03K 23/58; H03K 21/00; H03K 23/00; H03K 23/40; H03K 23/42; H03K 23/425; G06F 1/08
See application file for complete search history.

(56) References Cited

U.S. PATENT DOCUMENTS

| | | | | |
|---|---|---|---|---|
| 6,973,155 | B2* | 12/2005 | Boerstler | H03K 5/1252 327/146 |
| 9,077,348 | B1* | 7/2015 | Liu | H03K 23/546 |
| 9,941,889 | B1* | 4/2018 | Guo | H03L 7/23 |
| 11,705,907 | B2* | 7/2023 | Yao | G06F 1/3275 327/116 |
| 2024/0063799 | A1* | 2/2024 | Zhou | H03K 21/02 |
| 2025/0123650 | A1* | 4/2025 | Kamath | H03K 23/54 |

OTHER PUBLICATIONS

Application Note AN-1879 Fractional N F, Frequency Synthesis, Texas Instruments, Apr. 2013.
Data Sheet LMK6x Low Jitter, High-Performance BAW Oscillator, Texas Instruments, Apr. 2022.

* cited by examiner

*Primary Examiner* — Tuan T Lam
(74) *Attorney, Agent, or Firm* — Mandy Barsilai Fernandez; Frank D. Cimino

(57) ABSTRACT

An apparatus includes a counter having a clock input, a count value input, a third input, and an output. A multiplexer has a first input, a second input, a selection input, and an output. A delay circuit has a first input coupled to the clock input of the counter, a second input coupled to the output of the counter, a first output and a second output. The first output is coupled to the first input of the multiplexer, and the second output is coupled to the second input of the multiplexer. A fractional control circuit has a first output coupled to the selection input of the multiplexer and has a second output coupled to the third input of the counter.

20 Claims, 11 Drawing Sheets

FRACTIONAL FREQUENCY DIVIDER

CROSS-REFERENCE TO RELATED APPLICATIONS

This application claims priority to India Provisional Application No. 202341079142, filed Nov. 21, 2023, which is hereby incorporated by reference.

BACKGROUND

Many clock circuits include a frequency divider that divides down the frequency of an input clock to produce an output clock at a lower frequency. Some frequency dividers are integer dividers. An integer frequency divider can divide down the frequency by an integer value (e.g., 2, 3, 4, etc.).

SUMMARY

In one example, an apparatus includes a counter having a clock input, a count value input, a third input, and an output. A multiplexer has a first input, a second input, a selection input, and an output. A delay circuit has a first input coupled to the clock input of the counter, a second input coupled to the output of the counter, a first output and a second output. The first output is coupled to the first input of the multiplexer, and the second output is coupled to the second input of the multiplexer. A fractional control circuit has a first output coupled to the selection input of the multiplexer and has a second output coupled to the third input of the counter.

In another example, an apparatus includes a counter having a clock input, a count value input, an enable offset input, and an output. A synchronizer has a first input, a second input, a third input, and an output. The first input is coupled to the clock input, and the second input is coupled to the output of the counter. A fractional control circuit has a fractional control input and an output. The output of the fractional control circuit is coupled to the third input of the synchronizer. The fractional control circuit is configured to program a delay of the synchronizer based on a signal at the fractional control input and a clock output signal.

In yet another example, an apparatus includes a resonator having an output and a counter having a clock input coupled to the output of the resonator, a count value input, an enable offset input, and an output. A multiplexer has a first input, a second input, a third input, a selection input, and an output. A delay circuit has an input coupled to the clock input of the counter and has a first output, a second output, and a third output. The first output is coupled to the first input of the multiplexer, the second output is coupled to the second input of the multiplexer, and the third output is coupled to the third input of the multiplexer. A fractional control circuit has a control output coupled to the selection input of the multiplexer and has an enable offset output coupled to the enable offset input of the counter.

DETAILED DESCRIPTION

Figure 1:
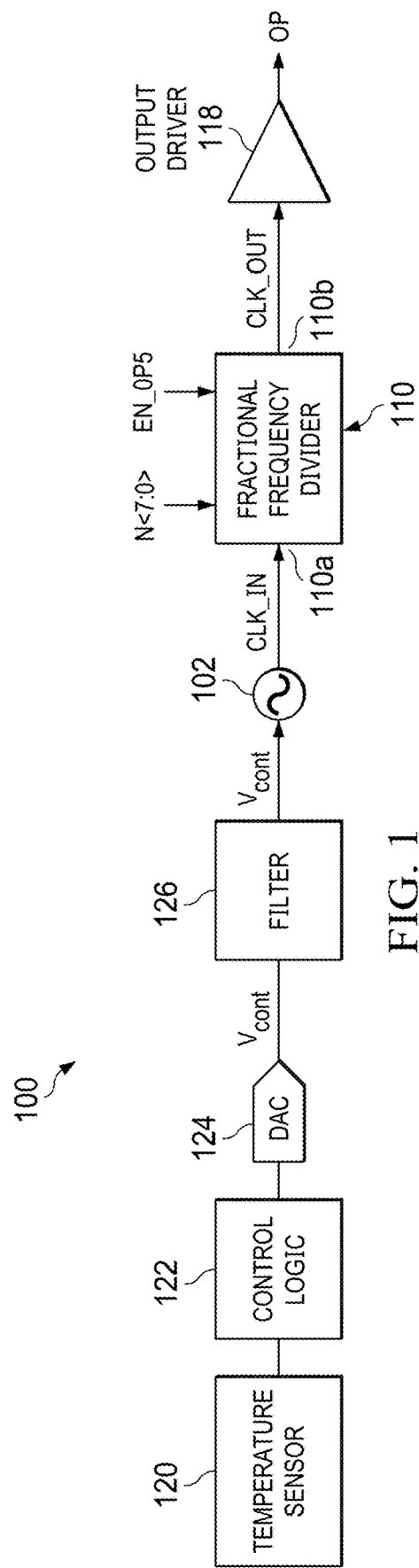
FIG. 1 is a block diagram of a resonator circuit that includes a fractional frequency divider, in an example.

The same reference numbers or other reference designators are used in the drawings to designate the same or similar (either by function and/or structure) features.

Some frequency dividers are programmable. By programming a particular divide value into the frequency divider, the frequency divider can divide down the input clock by that particular divide value. The number of different output frequencies depends on the number of different divide values that the frequency divider can accommodate. The frequency divider described herein is a fractional frequency divider which can accommodate fractional divide values. In one example, the divide values have a resolution of 0.5. A 0.5 resolution means that the frequency divider can accommodate divide values of, for example, 8, 8.5, 9, 9.5, and so on. The disclosed fractional frequency divider also generates an output clock having a duty cycle equal to or approximately equal to 50%. The disclosed fractional frequency divider also is a low power frequency divider.

FIG. 1 is a block diagram of a clock generator circuit 100 which includes a resonator 102, a fractional frequency divider 110, an output driver 118, a temperature sensor 120, control logic 122, a digital-to-analog converter (DAC) 124, and a filter 126. Resonator 102 may include a bulk acoustic wave (BAW) or other type of resonator. The output of resonator 102 is coupled to an input 110*a* of fractional frequency divider 110. Resonator 102 generates a clock signal (CLK_IN) to frequency divider 110. Fractional frequency divider 110 includes an output 110*b* which is coupled to an input of output driver 118. Fractional frequency divider 110 divides down the frequency of the clock signal CLK_IN by a programmable divide value. The divide value is provided to fractional frequency divider 110 by way of an integer divide value N<7:0> and an enable fractional division signal EN_0P5. In this example, the integer divide value N<7:0> is an 8-bit value but the integer divide value can be other than 8 bits in other examples. The enable fractional division signal EN_0P5 is a single bit signal. Fractional frequency division is enabled if enable fractional division signal EN_0P5 is a logic "1", and fractional frequency division is not enabled if enable fractional division signal EN_0P5 is a logic "0." For example, to specify a divide value of 12.5, the value of N<7:0> is "00001000" and enable fractional division signal EN_0P5 is a "1." To specify a divide value of 12, the value of N<7:0> is "00001000" and signal EN_0P5 is a "0." Fractional frequency divider 110 is capable of 0.5 resolution in the examples described herein (e.g., divide by 8, 8.5, 9, 9.5, etc.). The divided down output clock from fractional frequency divider 110 is output clock signal CLK_OUT, which is provided to output driver 118. The output signal from output driver 118 is OP.

The frequency of clock signal CLK_IN from resonator 102 may have a temperature dependence. For example, the frequency of clock signal CLK_IN may increase as temperature increases and decrease as temperature decreases. The combination of temperature sensor 120, control logic 122, DAC 124, and filter 126 provides temperature compensation for resonator 102. Control logic 122 may amplify the temperature signal from temperature sensor 120 and produces a digital code to be provided to DAC 124. The digital code helps to maintain the resonator's CLK_IN signal at a substantially constant frequency. DAC 124 converts the digital code from control logic 122 from a digital value to an analog signal. Filter 126 filters (e.g., low-pass filter) the analog signal from DAC 124 to produce a control signal Vcont to resonator 102. Resonator 102 adjusts the frequency of its output signal CLK_IN based on the magnitude of the control signal Vcont to thereby maintain the frequency of signal CLK_IN relatively immune to changes in temperature.

Figure 2:
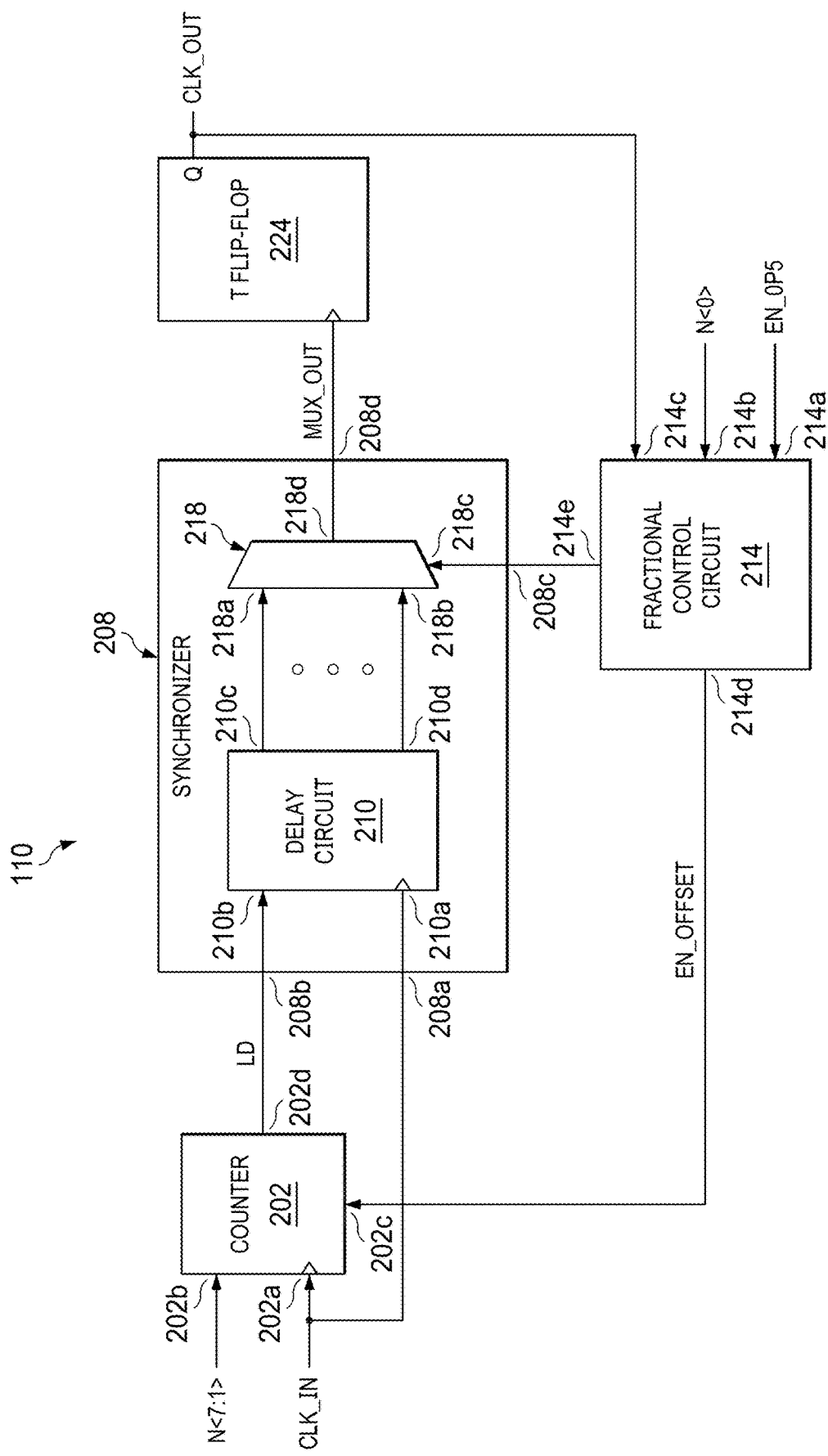
FIG. 2 is a block diagram of the fractional frequency divider of FIG. 1, in an example.

FIG. 2 is a block diagram of fractional frequency divider 110, in an example. Fractional frequency divider 110 includes a counter 202, a synchronizer 208, a fractional control circuit 214, and a T flip-flop 224. Synchronizer 208 includes a delay circuit 210 and a multiplexer (MUX) 218. Counter 202 has a clock input 202a, a count value input 202b, an enable offset input 202c, and an output 202d. Synchronizer 208 has inputs 208a, 208b, and 208c, and an output 208d. Fractional control circuit 214 has a fractional control input 214a, an input 214b, and an input 214c and outputs 214d and 214e. Clock signal CLK_IN is provided to clock input 202a and input 208a of counter 202 and synchronizer 208, respectively. The output 202d of counter 202 is coupled to input 208b of synchronizer 208. The Q output of T flip-flop 224, which provides the output signal, CLK_OUT, from fractional frequency divide 110, is coupled to input 214c of fractional control circuit 214. A T flip-flop changes the logic state of its output signal, CLK_OUT, upon each rising edge of the signal at its clock input. Output 214d of fractional control circuit 214 is coupled to enable offset input 202c of counter 202. Output 214e of fractional control circuit 214 is coupled to input 208c of synchronizer 208 and provides a multiplexer selection signal to the multiplexer. The least significant bit N<0> of the fractional divide value N<7:0> is provided to input 214b of fractional control circuit 214. The remaining bits N<7:1> other than the least significant bit N<0> are provided to count value input 202b of counter 202 as an initial count value. The enable fractional division signal EN_0P5 is provided to input 214a of fractional control circuit 214.

Delay circuit 210 has inputs 210a and 210b and outputs 210c and 210d. Input 210a of delay circuit 210 is coupled to input 208a of synchronizer 208, and input 210b is coupled to input 208b. Multiplexer has inputs 218a and 218b, a selection input 218c, and an output 218d. The output signal from MUX 218 is signal MUX_OUT. Output 210c is coupled to input 218a, and output 210d is coupled to input 218b. Although delay circuit 210 and multiplexer 218 are shown in the example of FIG. 2 to have two outputs and two inputs, respectively, the delay circuit and multiplexer may have more than two outputs and inputs. Output 218d of multiplexer 218 is coupled to output 208d of synchronizer 208. Selection input 218c of multiplexer 218 is coupled to input 208c of synchronizer 208.

Counter 202 includes a ripple counter whose output is coupled to a logic circuit, both of which are described below.

In operation, the ripple counter of counter 202 is loaded with a count value including the bits of the fractional divide value except for the least significant bit N<0>. The ripple counter decrements its output count value upon each rising edge of the clock signal CLK_IN. The logic circuit determines when the output count value from the ripple counter has reached 0 or 1, based on a control signal EN_OFFSET generated by fractional control circuit 214 at its output 214d, and changes the output signal LD of counter 202 from a logic low to a logic high. Two cycles later of clock signal CLK_IN, the logic circuit within counter 202 forces output signal LD back to a logic low state. Output signal LD is used in two regards. First, output signal LD is used to cause the ripple counter to reload its count value (N<7:1>). Second, output signal LD is used by synchronizer 208 to generate an output clock signal MUX_OUT from the synchronizer-. The delay circuit 210 of synchronizer 208 provides multiple different delayed versions of signal LD to the inputs of multiplexer 218. In one example, delay circuit 210 generates incremental half-clock cycle delay versions of signal LD at its outputs 210c and 210d. For example, the signal at output 210c is signal LD delayed by one-half of a clock cycle of input clock signal CLK_IN, and the signal at output 210d is signal LD delayed by a full cycle of input clock signal CLK_IN.

Fractional control circuit 214 generates the multiplexer selection signal at its output 214c based on, as described below, the output clock signal CLK_OUT, the least significant bit N<0> of the fractional divide value, and the enable fractional division signal EN_0P5. Accordingly, fractional control circuit 214 controls which of the delayed versions of signal LD is to be provided to the clock input of T flip-flop 224 to thereby generate the output clock signal CLK_OUT of clock generator circuit 100.

Figure 3:
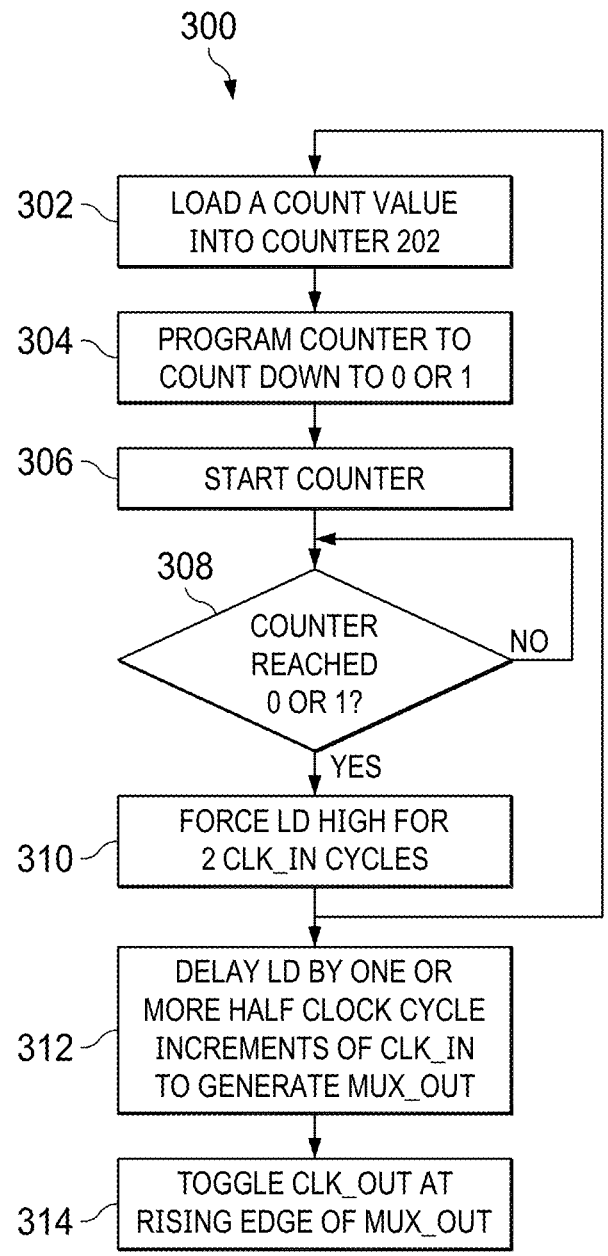
FIG. 3 is a flow diagram illustrating the operation of the fractional frequency divider of FIG. 2, in an example.

FIG. 3 is a flow diagram 300 illustrating the operation of the fractional frequency divider 110 of FIG. 2, in an example. At operation 302, a count value is loaded into counter 202. In one example, the count value is all of the bits of the integer divide value except for the least significant bit, N<7:1>. The count value is loaded into the ripple counter within counter 202 upon a rising edge of signal LD. At operation 304, counter 202 is programmed to count down to a terminal value of 0 or 1. In one example, fractional control circuit 214 generates control signal EN_OFFSET to counter 202 to configure the counter to count down to a value of 0 or 1. For example, control signal EN_OFFSET being a logic 0 configures counter 202 to down count to a terminal value of 1, and control signal EN_OFFSET being a logic 1 configures counter 202 to down count to a terminal value of 0.

At operation 306, the ripple counter within counter 202 begins down counting. At decision 308, a logic circuit within counter 202 determines whether the ripple counter output count value has reached the corresponding value of 0 or 1. If the ripple counter output count value has not reached the corresponding value of 0 or 1, the ripple counter continues down counting. If, however, the logic circuit determines that the ripple counter's output count value has reached the value of 0 or 1, then at operation 310, the logic circuit forces signal LD to a logic high state for multiple, for example, two cycles of the input clock signal CLK_IN. At operation 312, synchronizer 208 introduces a delay into the LD signal of one or more half clock cycle increments of CLK_IN to generate the MUX_OUT. Operation 302 is also performed again to load the count value into counter 202. Then, at operation 314, the logic state output clock CLK_OUT is toggled at the net rising edge of MUX_OUT.

Figure 4:
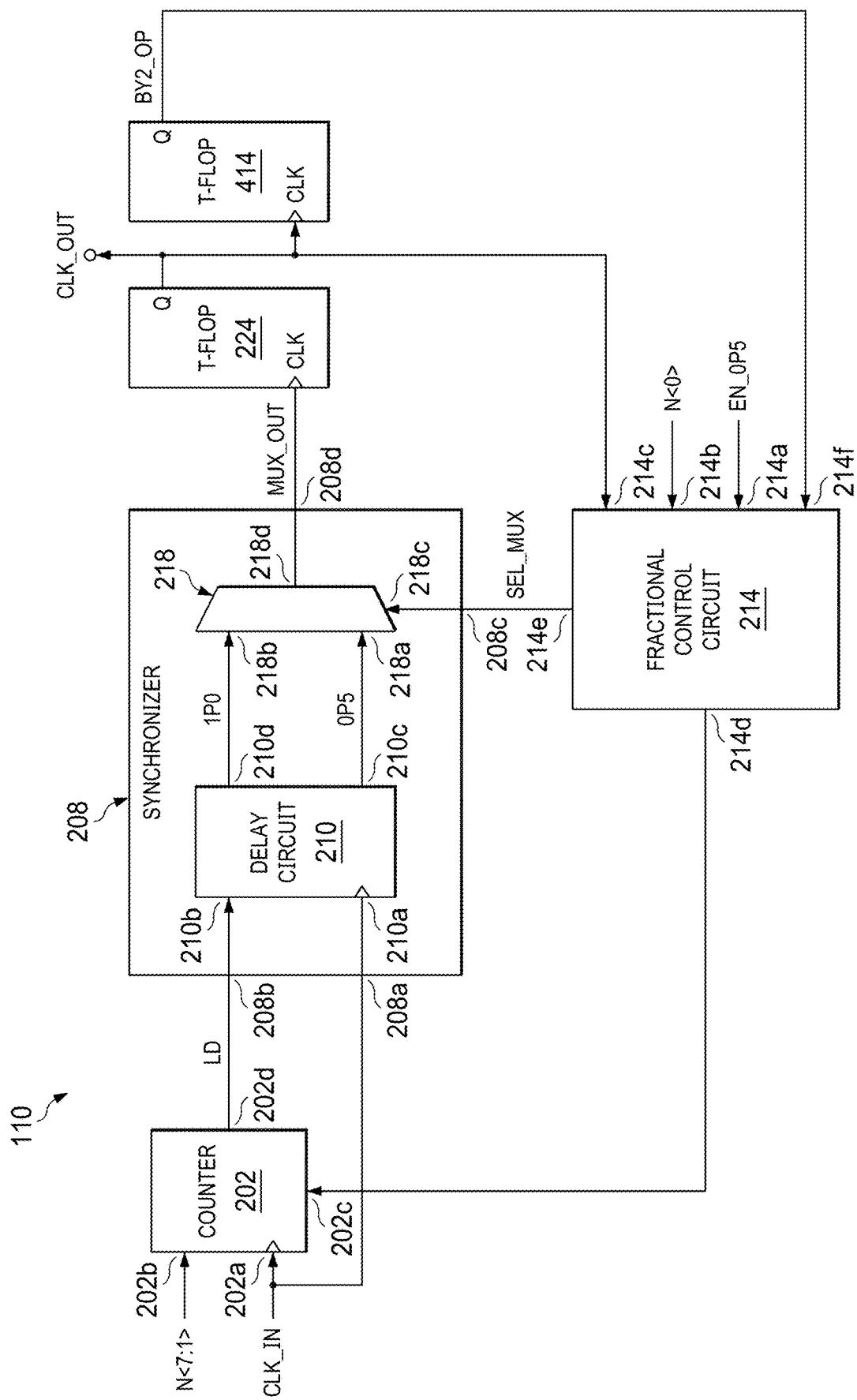
FIG. 4 is a block diagram of fractional frequency divider in another example.

FIG. 4 is a block diagram of fractional frequency divider 110 in another example. The example of FIG. 4 is similar to that of FIG. 2 but with an additional T flip-flop 414. The clock input of T flip-flop 414 is coupled to the Q output of T flip-flop 224. Because T flip-flop 414 is clocked with the signal at the Q output of T flip-flop 224, the signal BY2_OP at the Q output of T flip-flop 414 has half the frequency of the signal at the Q output of T flip-flop 224. Fractional control circuit 214 has an additional input 214f which is coupled to the Q output of T flip-flop 414.

Delay circuit 210 generates two delay signals 0P5 and 1P0 at its outputs 210c and 210d, respectively. Delay signal 0P5 is signal LD delayed by one-half clock cycle of CLK_IN. Delay signal 1P0 is signal LD delayed by a full clock cycle of CLK_IN. Multiplexer 218 provides either signal 0P5 or 1P0 through to the clock input of T flip-flop 224 based on the selection signal at its selection input 218c from fractional control circuit 214.

Fractional control circuit 214 generates the multiplexer selection signal, SEL_MUX in FIG. 4, at its output 214e based on the output clock signal CLK_OUT, signal BY2_OP, the least significant bit N<0> of the fractional divide value, and the enable fractional division signal EN_0P5. Fractional control circuit 214 generates the selection signal to multiplexer 218 to select either the half-clock cycle delayed signal 0P5 or the full clock cycle delayed signal 1P0.

The output clock signal CLK_OUT in the example fractional frequency divider 110 of FIG. 4 may be characterized by having a subharmonic frequency. Some applications of the frequency divider may not be affected by any subharmonic frequencies. For those applications that are detrimentally affected by subharmonic frequencies, the fractional frequency divider 110 of FIG. 5 can be used. The fractional frequency divider 110 of FIG. 5 reduces or eliminates the subharmonic frequency that may be present for the fractional frequency divider of FIG. 4.

Figure 5:
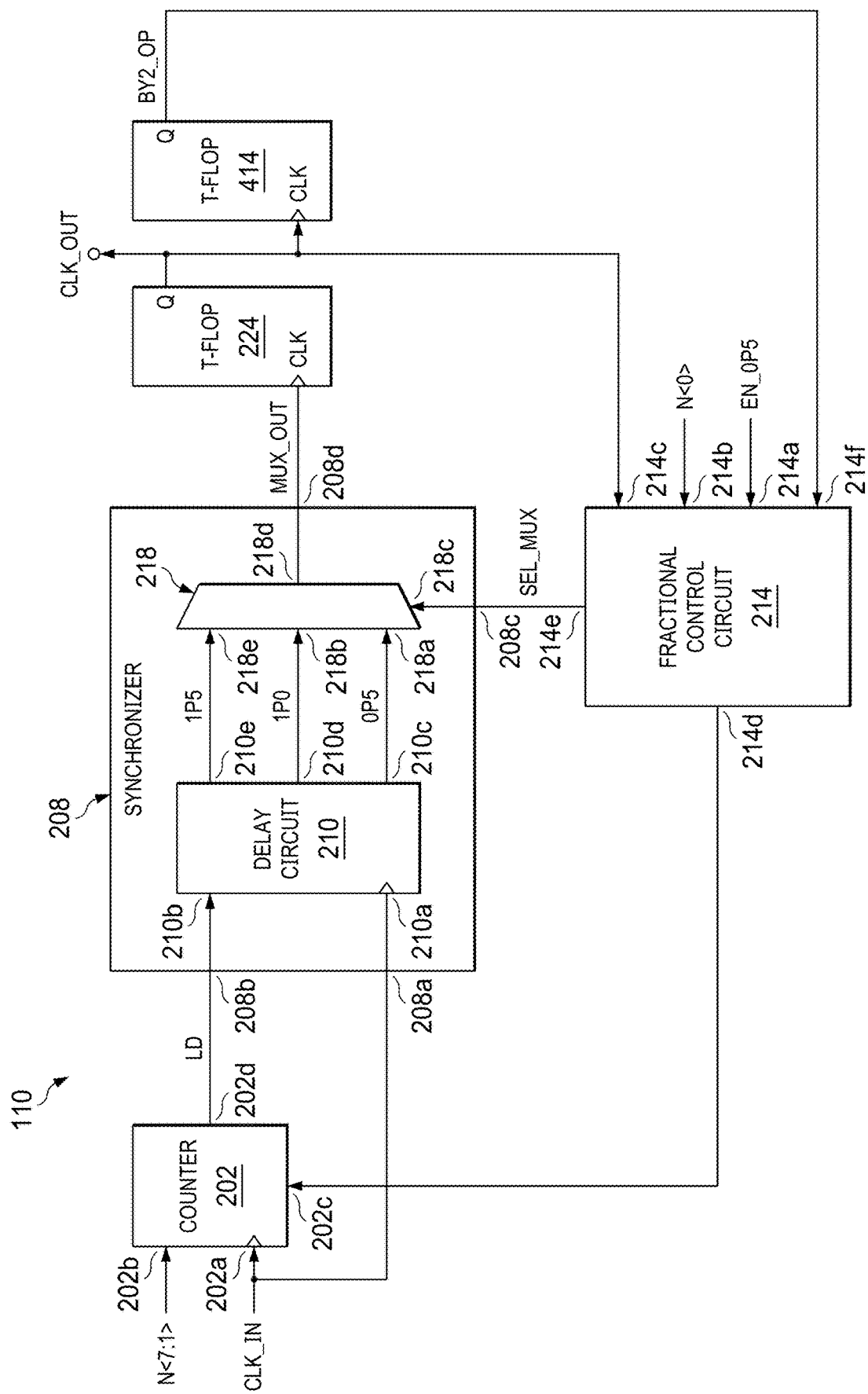
FIG. 5 is a block diagram of fractional frequency divider in yet another example.

The fractional frequency divider 110 of FIG. 5 is largely the same as the fractional frequency divider 110 of FIG. 4. A difference is that delay circuit 210 has an additional output 210e which provides a third LD delayed signal 1P5. Further, multiplexer 218 has an additional input 218c, coupled to output 210c of delay circuit 210. Signal 1P5 is a delayed version of signal LD delayed by 1.5 cycles of the input clock CLK_IN. By generating output clock signal CLK_OUT using any of three half-cycle delayed versions of signal LD, subharmonics are reduced or eliminated in CLK_OUT.

Figure 6:
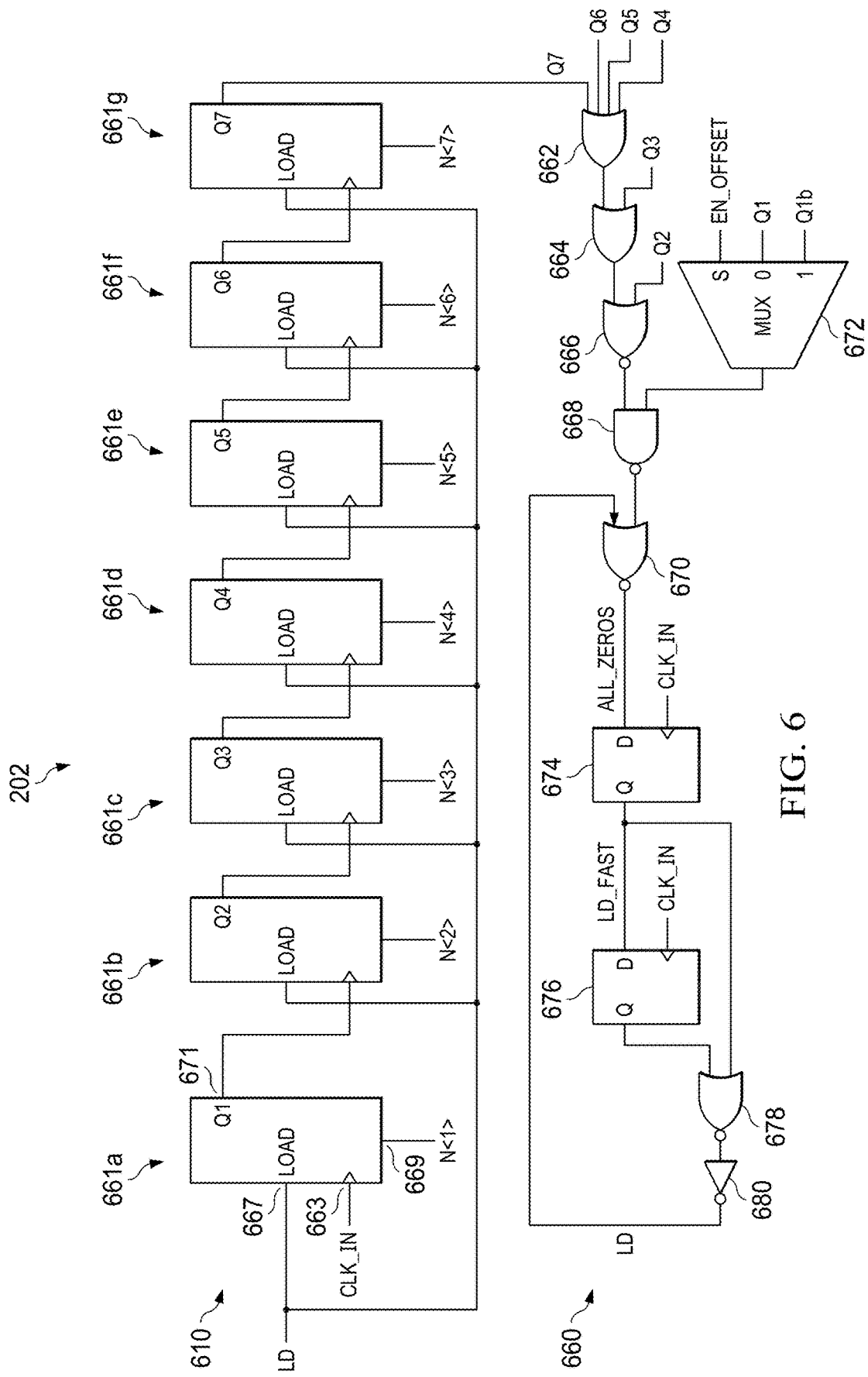
FIG. 6 is a schematic diagram of a counter included within the fractional frequency divider, in an example.

FIG. 6 is a schematic diagram of counter 202, in an example. Counter 202 includes a ripple counter 610 and a logic circuit 660. In this example, ripple counter 610 is a 7-bit ripple counter including seven ripple counter stages 661a, 661b, 661c, 661d, 661e, 661f, and 661g. Each ripple counter stage 661a-661g has a clock input, a load control input, a load input, and a Q output. For example, ripple counter stage 661a has a clock input 663,—a load control input 667, a load input 669, and a Q output (Q1) 671. The outputs of ripple counter stages 661a-661g are Q1, Q2, Q3, Q4, Q5, Q6, and Q7, respectively. Output Q1 is the least significant bit of the ripple counter's output count value and Q7 is the most significant bit of the output count value. The input clock CLK_IN is provided to the clock input 663 of ripple counter stage 661a. Each stage's output is coupled to the clock input of the next stage. For example, output 671 of ripple counter stage 661a is coupled to the clock input of ripple counter stage 661b, the output (Q2) of ripple counter stage 661b is coupled to the clock input of ripple counter stage 661c, and so on.

Signal LD is provided to the load control inputs of each of the ripple counter stages 661a-661g (e.g., load control input 667 of ripple counter stage 661a). Each bit of the initial count value N<7:1> is provided to each respective ripple counter stage's load input (e.g., load input 667). When signal LD is logic high, the corresponding bit value of the initial count value (N<1>, N<2>, etc.) is loaded into the corresponding ripple counter stage.

Logic circuit 660 includes OR gates 662 and 664, NOR gates 666, 670, and 678, NAND gate 668, inverter 680, flip-flops 674 and 676, and multiplexer 672. The Q3-Q7 outputs of ripple counter stages 663-667 are coupled to inputs of OR gates 662 and 664 as shown. The output of OR gate 662 is coupled to an input of OR gate 664. Ripple counter stage output bits Q3-Q7 are logically-ORed together by way of OR gates 662 and 664. The output of OR gate 664 is coupled to an input of NOR gate 666. The Q2 output of ripple counter stage 661b is coupled to the other input of NOR gate 666. The output of NOR gate 666 is coupled to an input of NAND gate 668. The control signal EN_OFFSET is provided to the selection(S) input of multiplexer 672. The Q1 output of ripple counter stage 661 (least significant bit of the ripple counter's output count value) is provided to the 0-input of multiplexer 672, and the logical inverse of the Q1 output (Q1b) is provided to the 1-input of the multiplexer. The output of multiplexer 672 is coupled to another input of NAND gate 668.

The output of NAND gate 668 is coupled to an input of NOR gate 670, and the output of inverter 680, which generates the signal LD, coupled to another input of NOR gate 670. The output of NOR gate 670 is coupled to a data input of flip-flop 674 and provides a signal ALL_ZEROS to the flip-flop's data input. The Q output of flip-flop 674 is coupled to the data input of flip-flop 676 and provides a signal LD_FAST to flip-flop 676. The clock inputs of flip-flops 674 and 676 receive the input clock CLK_IN. The Q output of flip-flop 676 is coupled to an input of NOR gate 678, and the Q output of flip-flop 674 is coupled to another input of NOR gate 678. The output of NOR gate 678 is coupled to an input of inverter 680.

Responsive to all of the Q2-Q7 bits being logic 0, the output signal from NOR gate 666 becomes logic 1. Depending on the selection signal EN_OFFSET, whichever bit—Q1 or Q1b—from multiplexer 672 also becomes a logic 1, the output signal from NAND gate 668 becomes logic 0. Initially, the signal LD is logic 0. With both inputs of NOR gate 670 being logic 0, NOR gate 670 forces its output signal ALL_ZEROS to be a logic 1, which indicates that all of the output bits Q1 (or Q1b) and Q2-Q7 are logic 0. Upon the next rising edge of CLK_IN, flip-flop 674 toggles its output signal LD_FAST to a logic 1 state. Upon the next ensuing rising edge of CLK_IN, flip-flop 676 toggles its output signal to a logic 1 state as well. With LD_FAST being a logic 1, the output signal from NOR gate 678 is a logic 0, thereby causing inverter 680 to force the signal LD to a logic 1 state. Accordingly, signals LD_FAST and LD become logic 1 at the next rising edge CLK_IN after signal ALL_ZEROS become logic 1. Signal LD_FAST remains at a logic 1 state for one cycle of CLK_IN and signal LD remains at a logic 1 state for two cycles of CLK_IN.

When signal LD becomes a logic 1, the corresponding input of NOR gate 670—becomes a logic 1, thereby causing NOR gate 670 to force its output signal ALL_ZEROS to a logic 0. Upon the next rising edge of CLK_IN, flip-flop 674 forces its output signal LD_FAST to a logic 0. Upon the next ensuing rising edge of CLK_IN, flip-flop 676 forces its output signal to a logic 0 state. The output signal from NOR gate 678 then becomes a logic 1 and, via inverter 680, the signal LD becomes a logic 0.

Figure 7:
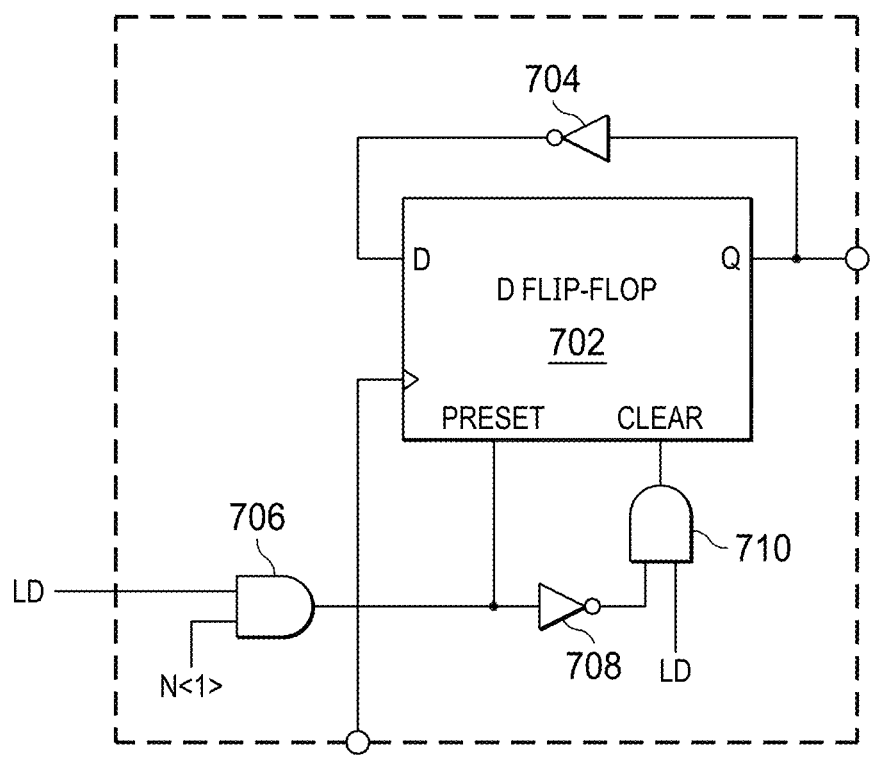
FIG. 7 is a schematic diagram of each of the ripple stages of a ripple counter within the counter of FIG. 6, in an example.

FIG. 7 is schematic diagram of an individual ripple counter stage for ripple counter 610. Each ripple counter stage 661a-661g includes a D flip-flop 702, inverters 704 and 708, and AND gates 706 and 710. The Q output of flip-flop 702 is coupled to an input of inverter 704, and the output of inverter 704 is coupled to the D input of D flip-flop 702. The LD signal and the initial count bit (e.g., N<1> for ripple counter stage 661a) are provided to inputs of AND gate 706. The output of AND gate 706 is coupled to an input of inverter 708, and to a PRESET input of D flip-flop 702. The output of inverter 708 is coupled to an input of AND gate 710. The LD signal is also provided to the other input of AND gate 710. The output of AND gate 710 is coupled to a CLEAR input of D flip-flop. When signal LD is logic high, the output of AND gate 706 is the same logic state as the initial count bit (e.g., N<1>) and the output of AND gate 710 is of the opposite logic state as the initial count bit. For example, when signal LD is logic high, if N<1> is a logic 1, then PRESET is a logic 1, CLEAR is a logic 0, and Q output is forced to an initial state of logic 1. By contrast, if N<1> is a logic 0 (when LD is a logic 1), then PRESET is a logic 0, CLEAR is a logic 1, and Q output is forced to an initial state of logic 0.

The signal provided to the clock input of D flip-flop 702 is CLK_IN in the case of ripple counter stage 661a or the Q output of the preceding ripple counter stage in the case of ripple counter stages 661b-661g, as described above. When signal LD is logic 0, upon occurrence of a rising edge at the clock input of D flip-flop 702, the Q output of the flip-flop 702 changes logic state. The Q output of D flip-flop 702 can be forced to a logic 0 or a logic 1 based on the state of the signal at the PRESET input. AND gate 706 logically ANDs together signal LD and the initial count bit. Accordingly, if the initial count bit is a logic 1 when signal LD is logic 1, then the flip-flop 702 sets its output Q to a logic 1.

Figure 8:
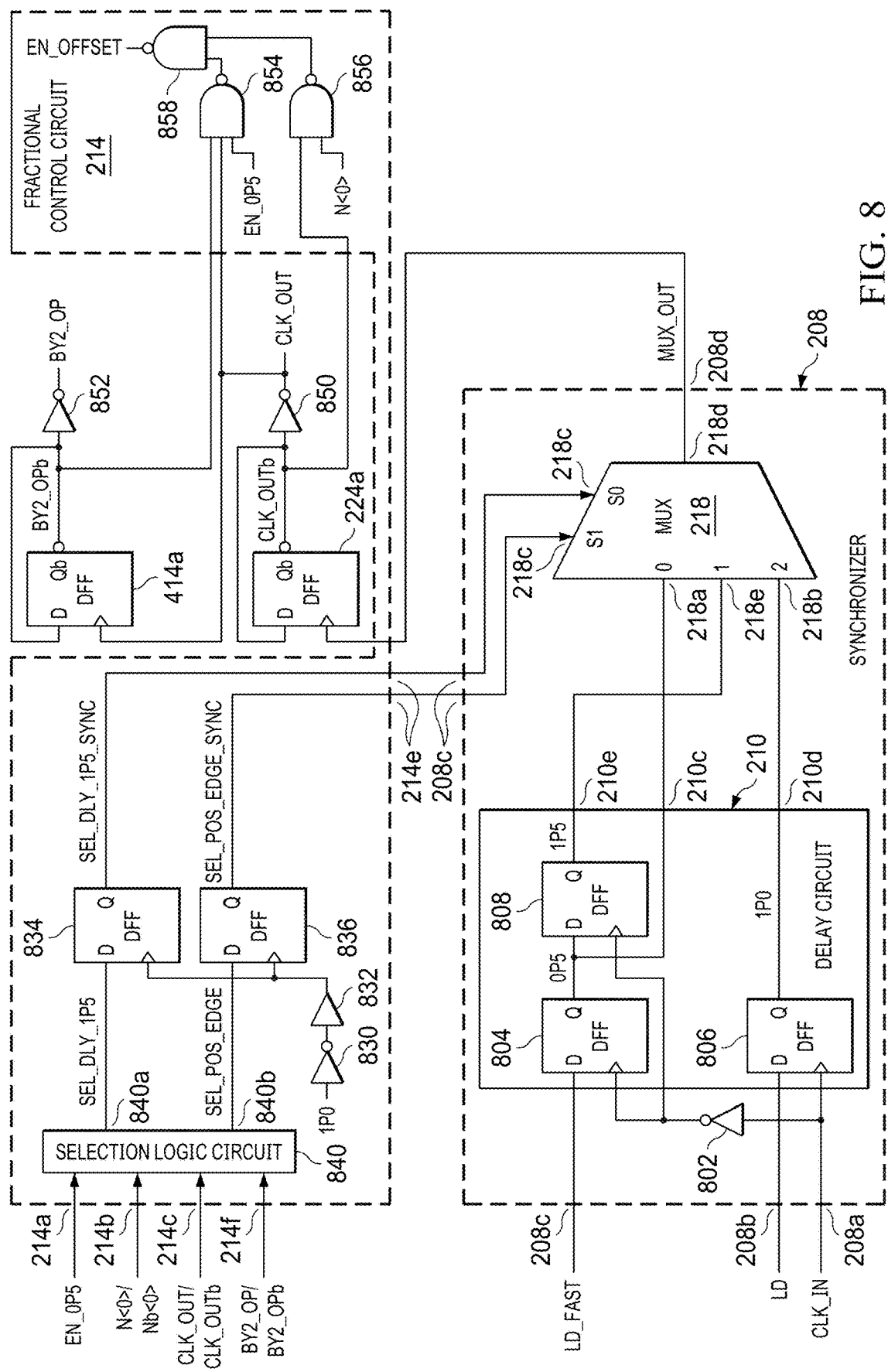
FIG. 8 is a schematic diagram of a synchronizer and factional control circuit of the fractional frequency divider, in an example.

FIG. 8 is a schematic diagram of synchronizer 208 and fractional control circuit 214, in an example. Delay circuit 210 includes inverter 802 and D flip-flops 804, 806, and 808. Fractional control circuit 214 includes an inverter 830, a buffer 832, D flip-flops 834 and 836, selection logic circuit 840, and NAND gates 854, 856, and 858. Input 208a of synchronizer 208 is coupled to the clock input of D flip-flop 806 and to the input of inverter 802. The output of inverter 802 is coupled to the clock input of D flip-flop 804. Input 208b is coupled to the D input of D flip-flop 806. Input 208c is coupled to the D input of D flip-flop 804. The Q output of D flip-flop 806 is coupled to output 210d of delay circuit 210 and to input 210b of multiplexer 218. The Q output of D flip-flop 804 is coupled to the D input of D flip-flop 808 and, via output 210c of delay circuit 210, to input 218a of multiplexer 218. The Q output of D flip-flop 808 is coupled to output 210e of delay circuit 210 and to input 218a of multiplexer 218.

D flip-flop 806 is clocked by a rising edge of clock signal CLK_IN. Via inverter 802, D flip-flops 804 and 808 are clocked upon a falling edge of clock signal CLK_IN. The output signal from D flip-flop 804 is delay signal 0P5, which is signal LD_FAST delayed by a half cycle of clock signal CLK_IN due to D flip-flop 804 being clocked upon a falling edge of CLK_IN. The output signal from D flip-flop 806 is delay signal 1P0, which is signal LD delayed by a full cycle of CLK_IN due to D flip-flop 806 being clocked by a rising edge of CLK_IN. The output signal from D flip-flop 808 is delay signal 1P5, which is signal LD_FAST delayed by one and half cycles of clock signal CLK_IN.

As described above, selection logic circuit 840 receives as inputs signals EN_0P5, N<0>/Nb<0> (logic inverse of N<0>), CLK_OUT/CLK_OUTb (logical inverse of CLK_IN), and BY2_OP/BY2_OPb (logic inverse of BY2_OP). Selection logic circuit 840 has outputs 840a and 840b. Output 840a is coupled to the D input of D flip-flop 834, and output 840b is coupled to the D input of D flip-flop 836. The signal at output 840a is signal SEL_DLY_1P5, and the signal at output 840b is signal SEL_POS_EDGE. Via inverter 830, D flip-flops 834 and 836 are clocked by the logical inverse of delay signal 1P0. Selection input 218c of multiplexer 218 is a two-bit selection input S0 and S1. The Q outputs of D flip-flops 834 and 836, which provide signals SEL_DLY_1P5_SYNC and SEL_POS_EDGE_SYNC, respectively, are coupled to S0 and S1, respectively, and provide signals SEL_DLY_1P5_SYNC and SEL_POS_EDGE_SYNC. Table I below is a truth table that specifies which input of multiplexer 218 is selected to provide its signal to as output signal MUX_OUT.

TABLE I

| SEL_POS_EDGE_SYNC | SEL_DLY_1P5_SYNC | Output |
|---|---|---|
| 0 | 0 | 0P5 (MUX input 0/218a) |
| 0 | 1 | 1P5 (MUX input 1/218e) |
| 1 | X | 1P0 (MUX input 2/218b) |

FIGS. 4 and 5 referred to T flip-flops 224 and 414. In FIG. 8, T flip-flops 224 and 414 are implemented as D flip-flops 224a and 414a, respectively. In addition to D flip-flops 224a and 414a, fractional frequency divider 110 includes inverters 850 and 852. The Qb output of D flip-flop 224a is coupled to the input of inverter 850 and to an input of NAND gate 856 and also provides clock signal CLK_OUTb. Another input of NAND gate 856 receives N<0>. The output of inverter 850 is coupled to an input of NAND gate 854 and to the clock input of D flip-flop 414a, and also provides the clock signal CLK_OUT. The Qb output of D flip-flop 414a is coupled to an input of inverter 852 and to an input of NAND gate 854 and also provides the signal BY2_OPb. Inverter 852 generates the signal BY2_OP at its output. Enable fractional division signal EN_0P5 is coupled to another input of NAND gate 854. The outputs of NAND gates 854 and 856 are coupled to inputs of NAND gate 858. The output signal of NAND gate 858 is the control signal EN_OFFSET.

Figure 9:
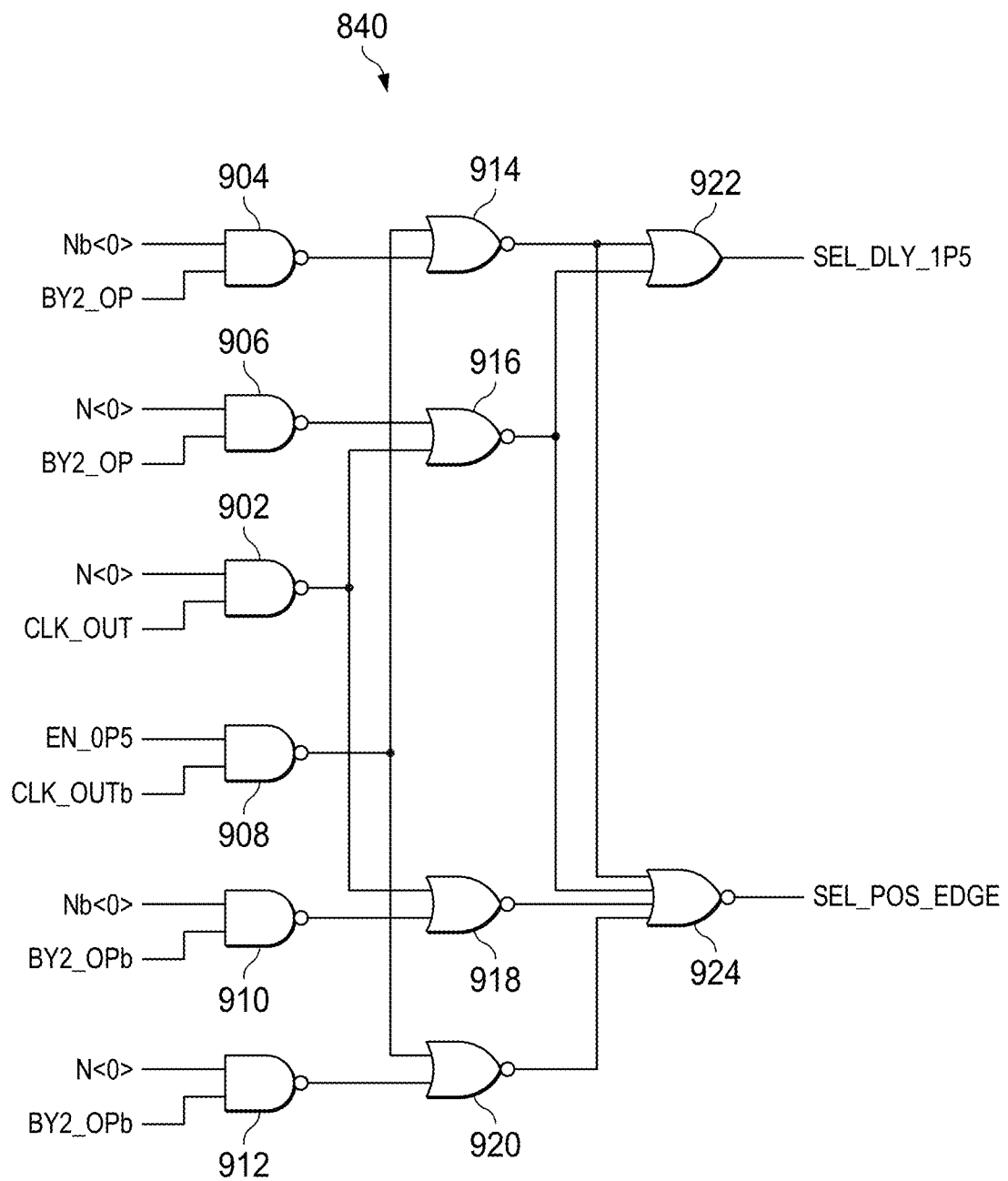
FIG. 9 is a schematic diagram of a selection logic circuit of the fractional control circuit of FIG. 8, in an example.

FIG. 9 is a schematic diagram of selection logic circuit 840, in an example. Selection logic circuit 840 includes NAND gates 902, 904, 906, 908, 910, and 912, NOR gates 914, 916, 918, 920, and 924, and OR gate 922. NAND gate 902 logically NANDs together N<0> and signal CLK_OUT. NAND gate 904 logically NANDs together Nb<0> and signalBY2_OP. NAND gate 906 logically NANDs together signals N<0> and signal BY2_OP. NAND gate 908 logically NANDs together signals EN_0P5 and CLK_OUTb. NAND gate 910 logically NANDs together Nb<0> and signal BY2_OPb. NAND gate 904 logically NANDs together Nb<0> and signal BY2-_OPb.

The output of NAND gate 902 is coupled to inputs of each of NOR gates 916 and 918. The output of NAND gate 904 is coupled to an input of NOR gate 914. The output of NAND gate 906 is coupled to an input of NOR gate 916. The output of NAND gate 908 is coupled to an input of each of NOR gates 914 and 920. The output of NAND gate 910 is coupled to an input of NOR gate 918. The output of NAND gate 912 is coupled to an input of NOR gate 920. The output from NOR gate 914 is coupled to an input of OR gate 922. The output of NOR gate 916 is coupled to inputs of OR gate 922 and NOR gate 924. The output of NOR gate 918 is coupled to an input of NOR gate 924. The output of NOR gate 920 is coupled to an input of NOR gate 924. The output signal from OR gate 922 is signal SEL_DEL_1P5, and the output signal from NOR gate 924 is signal SEL_POS_EDGE.

Signal SEL_DEL_1P5 is a logic 1 when either of the following conditions are true. First, signal SEL_DEL_1P5 will be a logic 1 upon occurrence of a falling edge of CLK_OUT when enable fractional division signal EN_0P5 is logic 1 while least significant bit N<0> of the fractional divide value N<7:0> is a logic 0 and signal BY2_OP is a logic 1. Second, signal SEL_DEL_1P5 will be a logic 1 when the following signals/bits are all logic 1: least significant bit N<0>, BY2_OP, and CLK_OUT. If neither of the aforementioned conditions are true, then signal SEL_DEL_1P5 is logic 0. The logic in FIG. 9 for generating signal SEL_POS_EDGE accounts for various cases depending on, for example, whether fractional frequency division has been enabled (signal EN_0P5 is enabled), the logic state of the output clock CLK_OUT, and whether the integer portion N<7:0> is an even or odd value.

Figure 10:
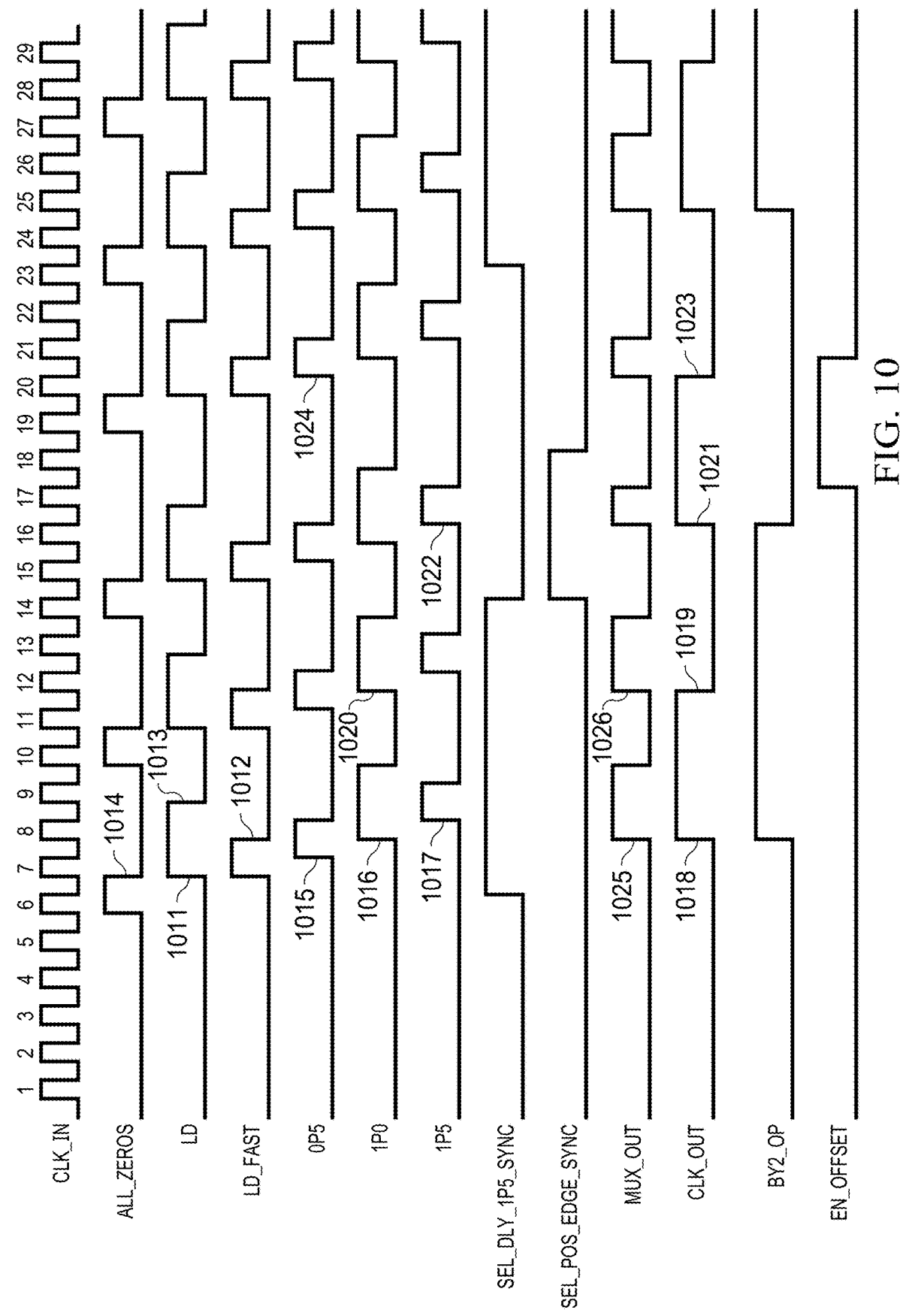
FIG. 10 is a timing diagram illustrating the operation of the fractional frequency divider of FIG. 5, in an example.

FIG. 10 is a timing diagram illustrating an example of the fractional frequency divider 110 of FIG. 5 dividing the clock signal CLK_IN by a divide value of 8.5 In this case, N<7:0> is 4 and enable fractional division signal EN_0P5 is logic 1. The signals in the timing diagram of FIG. 10 include CLK_IN, ALL_ZEROS, LD, LD_FAST, 0P5, 1P0, 1P5, SEL_DLY_1P5_SYNC, SEL_POS_EDGE_SYNC, MUX_OUT, CLK_OUT, BY2_OP and EN_OFFSET.

As described previously, upon counter 202 counting down to its terminal value (0 or 1 based on state of control signal EN_OFFSET), signals LD and LD_FAST transition from logic low to logic high as indicated at 1011. Signal LD_FAST remains high for one cycle of CLK_IN and then transitions back to logic low at 1012. Signal LD remains high for two cycles of CLK_IN and then transitions back to logic low at 1013. Because signal LD is provided to an input of NOR gate 670 (FIG. 6), as soon as signal LD becomes logic high, signal ALL_ZEROS becomes logic low at 1014. Delay signal 0P5, 1P0, and 1P5 from FIG. 5 are shown in FIG. 10. The rising edge 1015 of delay signal 0P5 is a half-cycle delayed from signal LD and LD_FAST. The rising edge 1016 of delay signal 1P0 is another half-cycle delayed relative to delay signal 0P5. The rising edge 1017 of delay signal 1P5 is a half-cycled delayed relative to delay signal 1P0.

MUX_OUT has a rising edge 1025 commensurate with the rising edge 1016 of delay signal 1P0, which has been selected through multiplexer 218 based on the logic state of signals SEL_DLY_1P5_SYNC and SEL_POS_EDGE_SYNC. D flip-flop 224a is clocked based on MUX_OUT and initiates a rising edge 1018 of CLK_OUT commensurate with the rising edge 1025 of MUX_OUT. The subsequent falling edge 1019 of CLK_OUT is triggered by the next rising edge 1026 of MUX_OUT, which itself is based on the rising edge 1020 of delay signal 1P0. In the next cycle of CLK_OUT, rising edge 1021 is triggered (via multiplexer 218's output signal MUX_OUT) by rising edge 1022 of delay signal 1P5 because fractional control circuit 214 has selected delay signal 1P5 from multiplexer 218, The subsequent falling edge 1023 of CLK_OUT coincides with rising edge 1024 of delay signal 0P5 because fractional control circuit 214 has selected delay signal 0P5 at that point.

Figure 11:
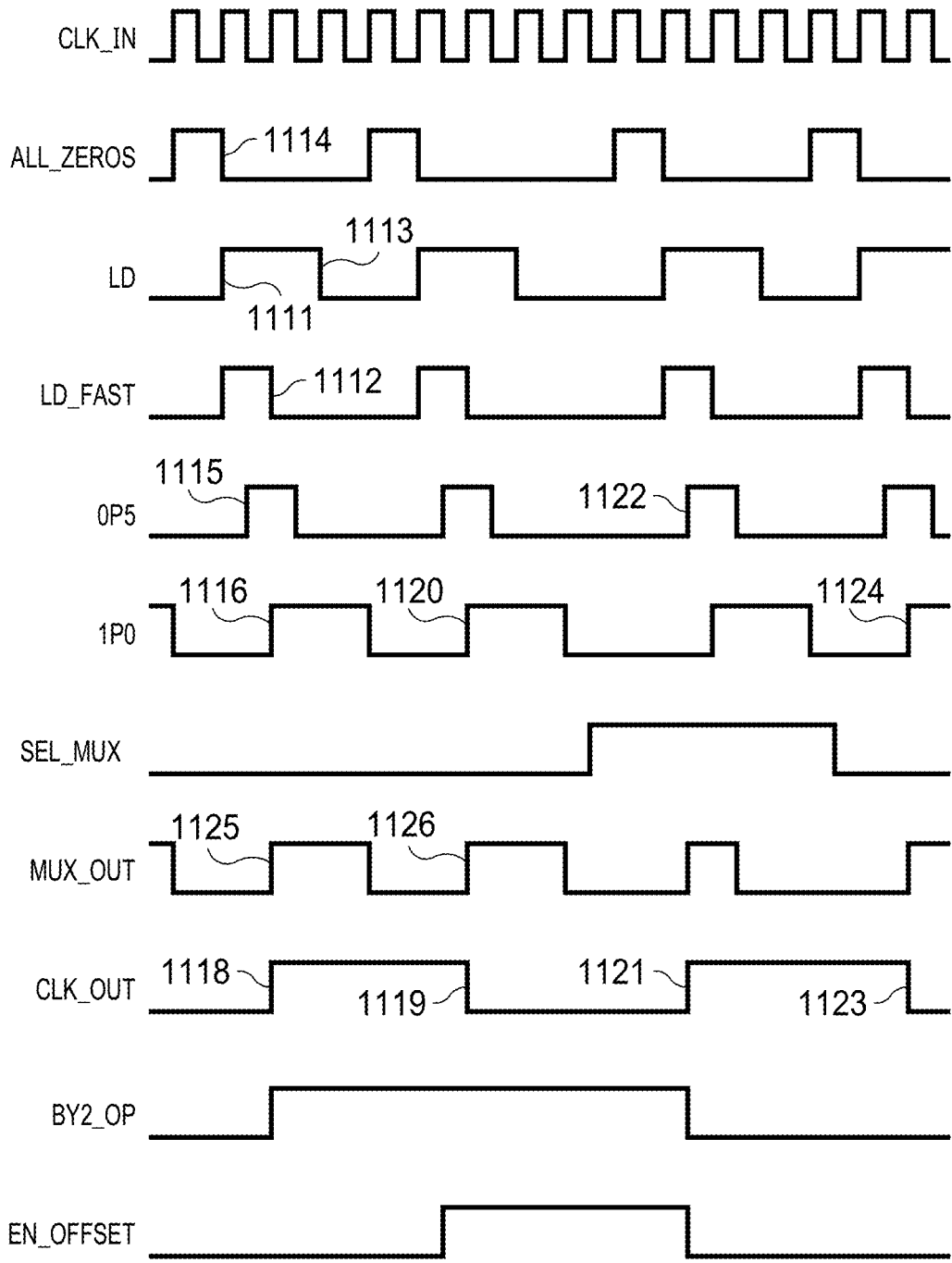
FIG. 11 is a timing diagram illustrating the operation of the fractional frequency divider of FIG. 4, in an example.

FIG. 11 is a timing diagram illustrating an example of the fractional frequency divider 110 of FIG. 4 dividing the clock signal CLK_IN by a divide value of 8.5 As in the example of FIG. 10, N<7:0> is 4 and enable fractional division signal EN_0P5 is logic 1. The signals in the timing diagram of FIG. 10 include CLK_IN, ALL_ZEROS, LD, LD_FAST, 0P5, 1P0, SEL_MUX, MUX_OUT, CLK_OUT, BY2_OP and EN_OFFSET.

As described previously, upon counter 202 counting down to its terminal value (0 or 1 based on state of control signal EN_OFFSET), signals LD and LD_FAST transition from logic low to logic high as indicated at 1111. Signal LD_FAST remains high for one cycle of CLK_IN and then transitions back to logic low at 1112. Signal LD remains high for two cycles of CLK_IN and then transitions back to logic low at 1113. Because signal LD is provided to an input of NOR gate 670 (FIG. 6), as soon as signal LD becomes logic high, signal ALL_ZEROS becomes logic low at 1114. Delay signal 0P5 and 1P0 from FIG. 4 are shown in FIG. 11. The rising edge 1115 of delay signal 0P5 is a half-cycle delayed from signal LD and LD_FAST. The rising edge 1116 of delay signal 1P0 is another half-cycle delayed relative to delay signal 0P5.

MUX_OUT has a rising edge 1125 commensurate with the rising edge 1116 of delay signal 1P0, which has been selected through multiplexer 218 based on the logic state of signal SEL_MUX. T flip-flop 224 is clocked based on MUX_OUT and initiates a rising edge 1118 of CLK_OUT commensurate with the rising edge 1125 of MUX_OUT. The subsequent falling edge 1119 of CLK_OUT is triggered by the next rising edge 1126 of MUX_OUT, which itself is based on the rising edge 1120 of delay signal 1P0. In the next cycle of CLK_OUT, rising edge 1121 is triggered (via multiplexer 218's output signal MUX_OUT) by rising edge 1122 of delay signal 0P5 because fractional control circuit 214 has selected delay signal 0P5 from multiplexer 218, The subsequent falling edge 1123 of CLK_OUT coincides with rising edge 1124 of delay signal 1P0 because fractional control circuit 214 has selected delay signal 1P0 at that point.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Modifications are possible in the described examples, and other examples are possible, within the scope of the claims.

What is claimed is:

1. An apparatus, comprising:
   a counter having a clock input, a count value input, a third input, and an output;
   a multiplexer having a first input, a second input, a selection input, and an output;
   a delay circuit having a first input coupled to the clock input of the counter, a second input coupled to the output of the counter, a first output and a second output, the first output coupled to the first input of the multiplexer, and the second output coupled to the second input of the multiplexer; and
   a fractional control circuit having a first output coupled to the selection input of the multiplexer and having a second output coupled to the third input of the counter.

2. The apparatus of claim 1, wherein the delay circuit is configured to:
   generate a first signal at the first output by delaying a signal at the output of the counter based on a falling edge of a clock signal at the clock input; and
   generate a second signal at the second output by delaying the signal at the output of the counter based on a rising edge of the clock signal.

3. The apparatus of claim 1, wherein:
   the multiplexer has a third input; and
   the delay circuit has a third output coupled to the third input.

4. The apparatus of claim 3, wherein the delay circuit is configured to:
   generate a first signal at the first output by delaying a signal at the output of the counter based on a rising edge of a clock signal at the clock input;
   generate a second signal at the second output by delaying the signal at the output of the counter based on a first falling edge of the clock signal; and
   generate a third signal at the third output by delaying the signal at the output of the counter based on a second falling edge of the clock signal.

5. The apparatus of claim 1, wherein the counter includes a ripple counter.

6. The apparatus of claim 5, wherein the multiplexer is a first multiplexer, the ripple counter has an output including bits which includes a first bit, and wherein the counter includes:
   a second multiplexer having a first input, a second input, and an output, the first input of the second multiplexer configured to receive the first bit, and the second input of the second multiplexer configured to receive a logical inverse of the first bit;
   a first logic gate having an input coupled to the output of the second multiplexer and having an output; and
   a second logic gate having an input coupled to the output of the first logic gate.

7. The apparatus of claim 1, wherein:
   the fractional control circuit has a first input, a second input, and a third input, and the fractional control circuit is configured to receive an output clock at the first input, a least significant bit of a divide value at the second input, and a enable fractional division signal at the third input; and
   the counter is configured to receive bits of the divide value other than the least significant bit at the count value input.

8. The apparatus of claim 7, further comprising a flip-flop having a clock input and an output, the clock input of the flip-flop configured to receive the output clock, and wherein the fractional control circuit has a fourth input coupled to the output of the flip-flop, the fractional control circuit is configured to generate a selection signal at the first output based on the output clock, a signal from the flip-flop at the fourth input, the least significant bit, and the enable fractional division signal.

9. An apparatus, comprising:
   a counter having a clock input, a count value input, an enable offset input, and an output;
   a synchronizer having a first input, a second input, a third input, and an output, the first input coupled to the clock input, and the second input coupled to the output of the counter; and
   a fractional control circuit having a fractional control input and an output, the output of the fractional control circuit coupled to the third input of the synchronizer, the fractional control circuit configured to program a delay for the synchronizer based on a signal at the fractional control input and an output clock signal from the apparatus.

10. The apparatus of claim 9, wherein the fractional control circuit has a second input configured to receive a least significant bit of a divide value, and wherein the counter is configured to receive, at the count value input, bits of the divide value other than the least significant bit of the divide value.

11. The apparatus of claim 9, wherein the synchronizer includes a multiplexer having a selection input coupled to the third input.

12. The apparatus of claim 11, wherein the multiplexer has a first input and a second input, and the synchronizer includes a delay circuit having a first delay output and a second delay output, the first delay output coupled to the first input of the multiplexer, and the second delay output coupled to the second input of the multiplexer.

13. The apparatus of claim 11, wherein the multiplexer has a first input, a second input, and a third input, and the synchronizer includes a delay circuit having a first delay output, a second delay output, and a third delay output, the first delay output coupled to the first input of the multiplexer, the second delay output coupled to the second input of the multiplexer, and the third delay output coupled to the third input of the multiplexer.

14. The apparatus of claim 9, wherein the counter includes a ripple counter.

15. The apparatus of claim 9, wherein:
the output of the fractional control circuit is a first output, and the fractional control circuit has a second output; and
the counter includes a ripple counter having outputs and a first circuit having inputs coupled to respective outputs of the ripple counter, the first circuit having a fractional control input coupled to the second output of the fractional control circuit.

16. An apparatus, comprising:
a resonator having an output;
a counter having a clock input coupled to the output of the resonator, a count value input, an enable offset input, and an output;
a multiplexer having a first input, a second input, a third input, a selection input, and an output;
a delay circuit having an input coupled to the clock input of the counter and having a first output, a second output, and a third output, the first output coupled to the first input of the multiplexer, the second output coupled to the second input of the multiplexer, and the third output coupled to the third input of the multiplexer; and
a fractional control circuit having a control output coupled to the selection input of the multiplexer and having an enable offset output coupled to the enable offset input of the counter.

17. The apparatus of claim 16, wherein the resonator is a bulk acoustic wave (BAW) resonator.

18. The apparatus of claim 16, wherein the counter includes a ripple counter.

19. The apparatus of claim 16, wherein:
the fractional control circuit has an input configured to receive a least significant bit of a divide value; and
the counter is configured to receive bits of the divide value other than the least significant bit at the count value input.

20. The apparatus of claim 19, wherein the input of the fractional control circuit is a first input, the fractional control circuit has a second input configured to receive an output clock and a third input configured to receive an enable fractional division signal, and the fractional control circuit is configured to generate a signal at the control output based on the output clock, the least significant bit, and the enable fractional division signal.

* * * * *